United States Patent
Chou et al.

(10) Patent No.: US 6,777,994 B2
(45) Date of Patent: Aug. 17, 2004

(54) CLOCK GENERATOR

(75) Inventors: Ju-Ming Chou, Hsinchu (TW);
Yu-Tang Hsieh, Hsinchu (TW);
Jieh-Tsorng Wu, Hsinchu (TW)

(73) Assignee: National Science Council, Taipei (TW)

( * ) Notice: Subject to any disclaimer, the term of this patent is extended or adjusted under 35 U.S.C. 154(b) by 6 days.

(21) Appl. No.: 10/271,553

(22) Filed: Oct. 17, 2002

(65) Prior Publication Data

US 2003/0137334 A1 Jul. 24, 2003

(30) Foreign Application Priority Data

Jan. 18, 2002 (TW) .......................................... 91100831 A

(51) Int. Cl.$^7$ ............................................... H03H 11/26
(52) U.S. Cl. ......................................... 327/269; 331/57
(58) Field of Search ................................ 327/269, 270, 327/271, 272; 331/57, 45

(56) References Cited

U.S. PATENT DOCUMENTS

| | | | | |
|---|---|---|---|---|
| 5,298,870 A | * | 3/1994 | Cytera et al. .................. | 331/45 |
| 5,420,547 A | * | 5/1995 | Kikuchi ........................ | 331/57 |
| 6,252,467 B1 | * | 6/2001 | Yoshimura .................... | 331/57 |
| 6,621,358 B2 | * | 9/2003 | Carballo et al. ............... | 331/57 |
| 2002/0000885 A1 | * | 1/2002 | Horikawa et al. ............. | 331/15 |

* cited by examiner

Primary Examiner—Linh M. Nguyen
(74) Attorney, Agent, or Firm—Bacon & Thomas, PLLC

(57) ABSTRACT

To reduce the effect of the phase shift error originated from the mismatch of the delay units of the clock generator, we propose to add one more set of averaging amplifiers and averaging impedances, such as resistors, into the circuit of the clock generator. In the clock generator, outputs of all delay units connect to inputs of all averaging amplifiers respectively, and the averaging impedances connect the corresponding outputs of two adjacent averaging amplifiers, so as to form a closed loop. When a phase shift error occurs in the delay units, the averaging current through the averaging impedances will decrease the phase shift error in each stage. Specifically, the output impedance of the averaging amplifiers approaches infinite, and thus the resistance of the averaging impedances is relatively small. Therefore almost all signal currents will go through the averaging impedances, and an optimal averaging effect is achieved. In addition, we apply the simple voltage-mode phase interpolation technique to the averaging impedances for better phase resolution and more output phases. Further, utilizing the folding architecture, our proposed clock generator can output high-frequency clock signals at low-frequency operating clock.

7 Claims, 7 Drawing Sheets

Output Clock

Output Clock

CLOCK GENERATOR

FIELD OF THE INVENTION

This invention is applicable to the circuit of the clock generator inside IC chip. Specifically, the invention is primarily applicable to reduce and eliminate the mismatch effect in the delay units of the clock generator. On the other hand, this invention is also applicable to generate exacter and more phases in a clock period and output high-frequency clock signals at low-frequency operating clock.

BACKGROUND OF THE INVENTION

Because the ring-type oscillators and the delay lines composed of delay units can output accurate phase delay, these circuits are widely used in the integrated circuit design. Their applications include: clock timing and synchronous circuit, time-to-digital converter, and timing recovery circuit.

In a few high-speed systems, output phases of all delay units will link to outer parts for controlling the procedure of data processing. Because with the increasing of the applied operating frequency, the period of data processing is getting shorter and shorter. Also, if the circuits of the delay units don't match with outer environment and inner status, the timing margin of the clock signal will get much narrower to raise the complexity of the data processing terribly. Furthermore, with the ongoing advance of fabrication process, the problem of circuit mismatch will be getting worse and worse because of the circuit element's shrinkage.

On the other hand, the minimum phase resolution of the clock generator composed of delay units is the delay time of one delay unit. So as far as a single-output system is concerned, the better phase resolution is achieved by the current-mode phase interpolation circuit. As for a multi-output system, the better resolution is achieved by the array of ring-type oscillators or the array of delay lines. In spite of more accurate phase resolution can be acquired in these ways, the overall circuit area, power consumption, and system complexity will totally get increasing.

SUMMARY OF THE INVENTION

In the invention, a clock generator is proposed. Specifically, the circuit of the proposed clock generator is added with a set of averaging amplifiers and averaging impedances, here is using resistors for example, for resolving the non-linearity problem of the mismatch effect of the delay units. And, the proposed clock generator uses voltage-mode phase interpolation circuit constructed of resistors to promote the phase resolution.

The invention proposes that if outputs of all delay units connect to inputs of all averaging amplifiers separately, the averaging amplifiers will act as buffers to make the delay units independent of variation of external loads. Generally, in order to reduce the non-linearity problem originated from the mismatch effect, the averaging impedances connect the corresponding outputs of two adjacent averaging amplifiers and all other averaging amplifiers proceed to connect mutually to form a whole closed loop. Because the load of the averaging amplifier is a pair of current sources, i.e. a load with infinite output impedance, most of signal currents will go into the averaging impedances. Moreover, if the resistance of the averaging impedances is much smaller than the impedance of the averaging amplifiers, the non-linearity phase problem will be resolved to achieve optimization.

On the other hand, in two adjacent averaging amplifiers, the invention proposes to apply the simple voltage-mode phase interpolation technique to the averaging impedances for better phase resolution and more accurate phase interval. It is obtained by directly linking the lines out of the nodes of the averaging impedances.

In the invention, the characteristics and advantages of the circuit architecture will be further clarified in the following figures and illustrations for more detailed comprehension.

DETAILED DESCRIPTION OF INVENTION

Figure 1:
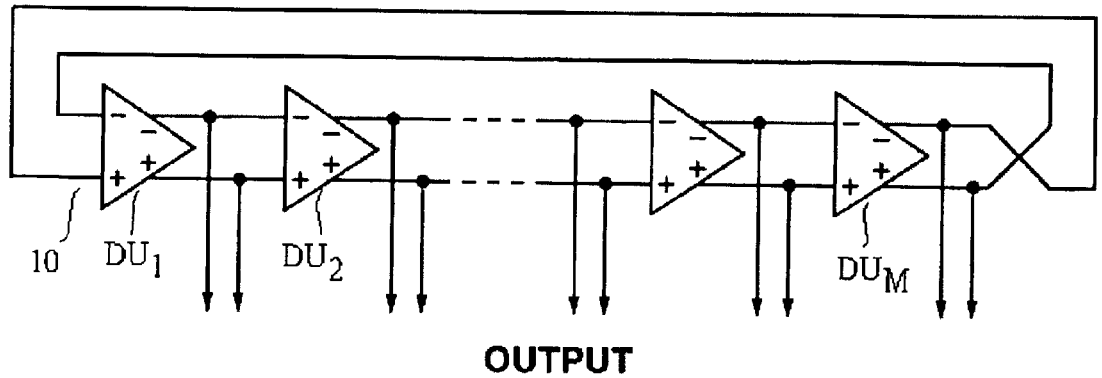
FIG. 1 shows one architecture of ring-type oscillator composed of conventional delay units.

Preferred embodiments of the present invention includes (but not limited to) the following:

1. A clock generator, which comprises:

M delay units (DU) in order of 1 to M, each one of which has invert (−) and non-invert (+) inputs, and further has invert (−) and non-invert (+) outputs, wherein a phase difference between two clock signals from the invert (−) and non-invert (+) outputs in each delay unit (DU) is substantially 180 degrees, and a phase interval between the invert outputs of each two adjacent delay units is substantially equivalent to θ, wherein M is an integer greater than 2;

a first set of averaging impedances (Ra), wherein the n-th averaging impedance ($Ra_n$) is connected to the invert (−) outputs of the (n−1)-th DU and n-th DU, wherein n is an integer greater than 1 and up to M, and M is defined as above; and a second set of averaging impedances (Rb), wherein the n-th averaging impedance ($Rb_n$) is connected to the non-invert (+) outputs of the (n−1)-th DU and n-th DU, wherein both n and M are defined as above, wherein the first and second sets of the averaging impedances have substantially identical impedance, so that a phase shift error originated from mismatch effect among the M DUs will generate an averaging current flowing through the first and second sets of averaging impedances, and thus phase shift error will be reduced compensatively.

2. The clock generator as described in item 1 further comprising:

M averaging amplifiers (AP), each one of which has two inputs and two outputs, wherein two inputs of the (n−1)-th AP are connected to the two inputs of the (n−1)-th DU, wherein $Ra_n$ connects the first output of the (n−1)-th AP to the first output of the n-th AP, and $Rb_n$ connects the second output of the (n−1)-th AP to the second output of the n-th AP, wherein n, M, $Ra_n$, and $Ra_n$ are defined as those in claim 1, wherein the M APs act as buffers among the M DUs, the first set of averaging impedances, and the second set of averaging impedances, in order to make the M DUs independent from a variation effect of the first set and second set of averaging impedances.

3. The clock generator as described in item 2 further comprising:

2M high-impedance loads, each of which has the impedance higher than that of the first set of averaging impedances and that of the second set of averaging impedances, wherein the 2M high-impedance loads are connected to the first and second outputs of the M averaging amplifiers separately, so that the averaging current from the first outputs of the M averaging amplifiers substantially all flow through the first set of averaging impedances, and that the averaging current from the second outputs of the M averaging amplifiers substantially all flow through the second set of averaging impedances.

4. The clock generator as described in item 1, wherein the first and second sets of averaging impedances are all resistors.

5. The clock generator as described in item 3, wherein the 2M high-impedance loads are current sources.

6. The clock generator as described in item 1 further comprising:

a first set of N−1 nodes located in the first set of averaging impedances; and a second set of N−1 nodes located in the second set of averaging impedances, wherein N is an integer greater than 1, the first and second sets of nodes divide the first and second sets of averaging impedances into equal-resistance N segments, separately, so that two corresponding nodes between the first and the second sets of the averaging impedances will be able to output two clock signals whose phase difference is substantially 180 degrees, and each two adjacent nodes will output two clock signals whose phase interval is θ/N.

7. The clock generator as described in item 2 further comprising:

a first set of N−1 nodes located in the first set of averaging impedances; and a second set of N−1 nodes located in the second set of averaging impedances, wherein N is an integer greater than 1, the first and second sets of nodes divide the first and second sets of averaging impedances into equal-resistance N segments, separately, so that two corresponding nodes between the first and the second sets of the averaging impedances will be able to output two clock signals whose phase difference is substantially 180 degrees, and each two adjacent nodes will output two clock signals whose phase interval is θ/N.

8. The clock generator as described in item 3 further comprising:

a first set of N−1 nodes located in the first set of averaging impedances; and a second set of N−1 nodes located in the second set of averaging impedances, wherein N is an integer greater than 1, the first and second sets of nodes divide the first and second sets of averaging impedances into equal-resistance N segments, separately, so that two corresponding nodes between the first and the second sets of the averaging impedances will be able to output two clock signals whose phase difference is substantially 180 degrees, and each two adjacent nodes will output two clock signals whose phase interval is θ/N.

9. The clock generator as described in item 2, wherein the 2M outputs of the M APs are divided into W segments in phase order with an equal number of outputs, wherein W is an odd number, and all corresponding outputs from each segment are tied together, so that clock signals from the resulting tied outputs have a clock period of (2 MTd)/W, wherein Td is delay time of a single delay unit of said M delay units.

FIG. 1 shows an architecture of the ring-type oscillator circuit 10 composed of conventional delay units. The ring-type oscillator is a feedback loop cascaded of a set of M delay units, $DU_1$ to $DU_M$. The overall phase difference between the first and last DUs in the feedback loop is 180 degrees so as to produce the oscillation effect. Because the circuit is cascaded of M identical delay units, the oscillation period is easily known as 2 MTd, where Td is the delay time of one delay unit.

In a few circuit systems, the constant characteristic of the delay time Td of each delay unit in the ring-type oscillator is used. It links out all output phases of delay units to control the procedure of data processing for improvement of overall system performance.

However, there are still a lot of factors to cause the mismatch effect among delay units. The mismatch effect will cut the timing margin of the clock signal to raise the complexity of the data processing terribly. The occurring reasons of the mismatch effect are, for example, defects of somewhere in the silicon substrates or deviation of the element's fabrication process. With the ongoing advance of the fabrication process, the mismatch effect will be getting more serious because of the circuit element's shrinkage.

Figure 2:
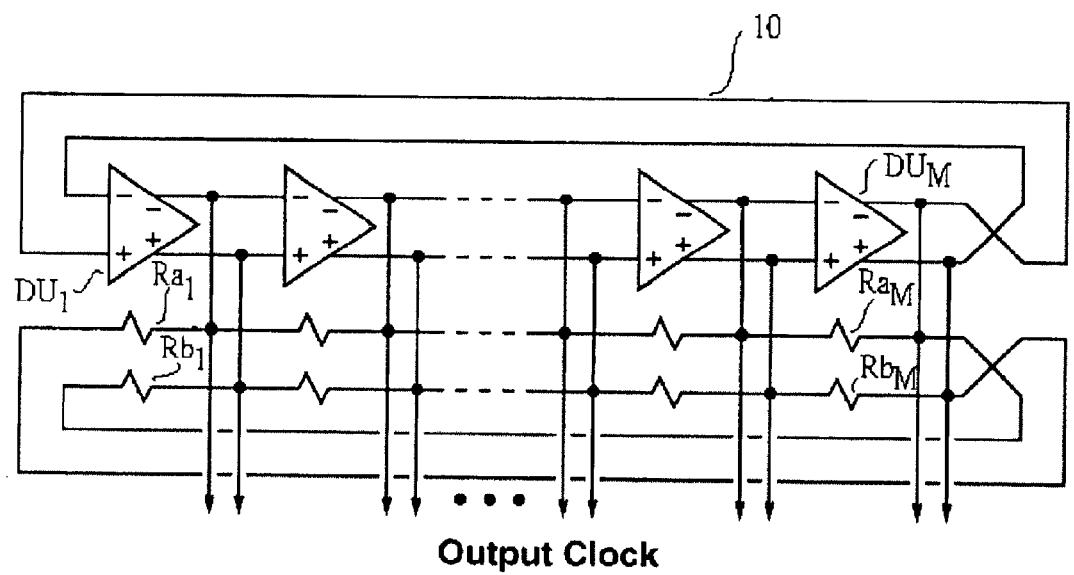
FIG. 2 shows one architecture of averaging circuit according the proposed invention.

FIG. 2 shows one specific architecture of the clock generator in the proposed invention. It can reduce the phase shift error of the output produced from the mismatch effect of the delay units. The architecture in FIG. 2 covers the ring-type oscillator 10. The design consideration and specification of the oscillator 10 in FIG. 1 and FIG. 2 are the same. In addition, in FIG. 2, the architecture also constructs two sets of averaging impedances, $Ra_1$ to $Ra_M$ and $Rb_1$ to $Rb_M$, where all are resistors. Resistance of all used resistors in FIG. 2 is identical, and two sets of averaging impedances connect to the corresponding outputs of each two adjacent delay units, $DU_1$ to $DU_M$, respectively. At last, when the overall phase difference between the first and last delay units is achieved to 180 degrees, the last ones of two sets of averaging impedances will cross-connect to the first ones of the other set of averaging impedances separately, i.e. $Ra_1$ to $Rb_M$ and $Rb_1$ to $Ra_M$, in order to remove the redundant phase shift error resulting from the structural mismatch of averaging circuit.

Averaging impedances make use of the averaging current effect to reduce the phase shift error of the faulty delay unit compensatively. The averaging current effect is generated from the delay units next to the faulty delay unit. For example of FIG. 2, if the most right delay unit produces a phase shift error because of the component mismatch effect, the faulty delay unit will generate an averaging current from itself into the adjacent delay units on both sides. Then these two delay units on right and left sides proceed with the averaging current effect successively to make a smaller phase shift, and these two delay units on right and left sides regenerate a much smaller averaging current flowing into their own adjacent delay units on both sides. The averaging effect continues passing to both sides again and again until the effect of the phase shift error disappears. The phase shift error of the faulty delay unit will decrease, while the averaging current is passing through the adjacent delay units on both sides again and again. In general, the phase shift error improved by the averaging effect becomes smaller than the phase shift error of the original ones without the averaging effect. On the other hand, the performance of the averaging effect depends on the resistance of the averaging impedances. When the resistance of the impedances becomes smaller, the resulting averaging current will increase so that the improvement of the phase shift error will be more apparent.

However, the operating principle of conventional ring-type oscillator is usually that the output loading capacitance of the delay units is constant and makes use of the control signal to control the output impedance of the delay units for adjusting the oscillation period of the overall ring-type oscillator. Therefore, if the averaging impedance is not greatly more than the output impedance of the ring-type oscillator, the oscillation period of the oscillator will depend only upon the averaging impedance, not upon the control signal. But if the averaging impedance is too large, the reduced effect on the phase shift error will not be apparent.

Figure 3:
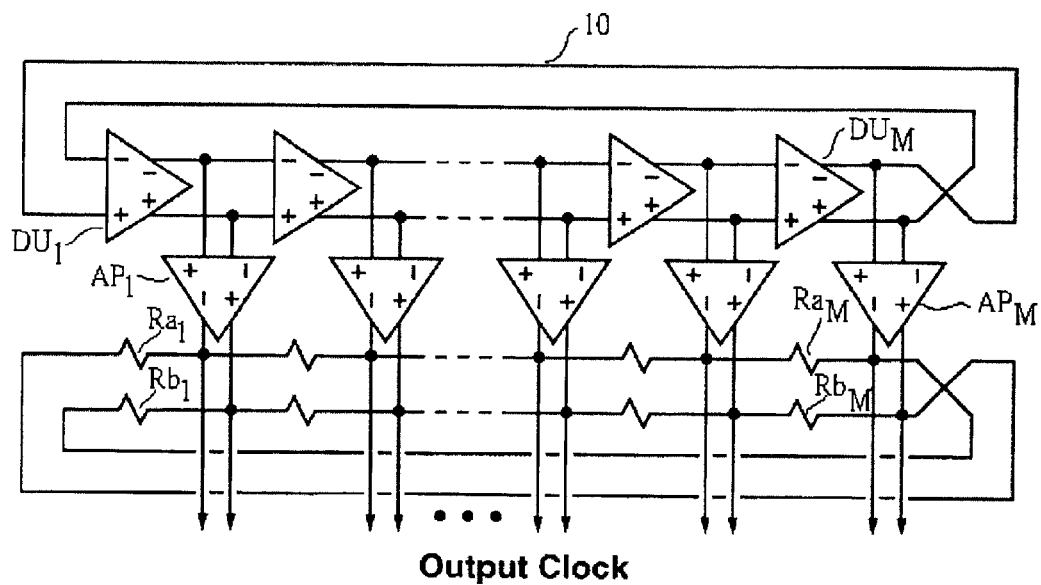
FIG. 3 shows another architecture of the averaging circuit according the proposed invention.

FIG. 3 shows another specific architecture of the clock generator in the proposed invention. This specific architecture can be applied to achieve optimal averaging performance, and doesn't affect the ring-type oscillator's operation. The architecture in FIG. 3 contains not only the ring-type oscillator 10 in FIG. 2 and two sets of averaging impedances, $Ra_1$ to $Ra_M$ and $Rb_1$ to $Rb_M$, but also a set of averaging amplifiers, $AP_1$ to $AP_M$, whose number is the same as that of the loop of delay units, $DU_1$ to $DU_M$. The averaging amplifiers, $AP_1$ to $AP_M$, play a role of buffers between the ring-type oscillators and averaging impedances in order to make the oscillator's operation independent of the variation effect of external impedances. Meanwhile, the resistance of the averaging impedances influences the averaging effect and the gain of the averaging amplifiers. Therefore, the resistance of the averaging impedances can be decreased further until it achieves the minimum resistance within the gain margin of the averaging amplifier in the system for optimization of averaging effect.

Figure 4:
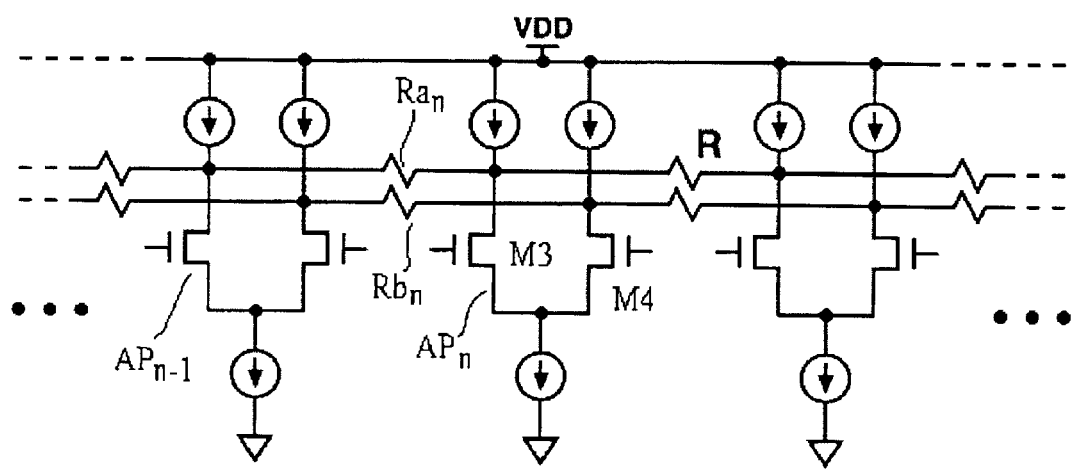
FIG. 4 shows the specific architecture of the averaging amplifier circuit with averaging impedances.

FIG. 4 shows the brief diagram of the specific circuit implementation of the averaging amplifier $AP_n$ and the averaging impedances, $Ra_n$ and $Rb_n$, in FIG. 3. In FIG. 4, the averaging amplifier $AP_n$ is a fully differential amplifier, and its load is a pair of current sources with nearly-infinite output impedance. Besides, two sets of averaging impedances with the same resistance link to the corresponding outputs of two adjacent averaging amplifiers respectively. For instance, the resistor $Ra_n$ connects the negative output of the averaging amplifier $AP_{n-1}$ with that of the averaging amplifier $AP_n$. And, the resistor $Rb_n$ connects the nonnegative output of the averaging amplifier $AP_{n-1}$ with that of the averaging amplifier $AP_n$. Because the output loading impedance of the averaging amplifier approaches infinite, the signal currents hardly flow into the loading impedances. Therefore, in the averaging amplifier $AP_n$, most of output currents originated from a pair of differential source-coupled transistors, M3 and M4, will go through the averaging impedances. The more currents go through the averaging impedances, the more apparent the reduced effect on the phase shift error will be.

Figure 5:
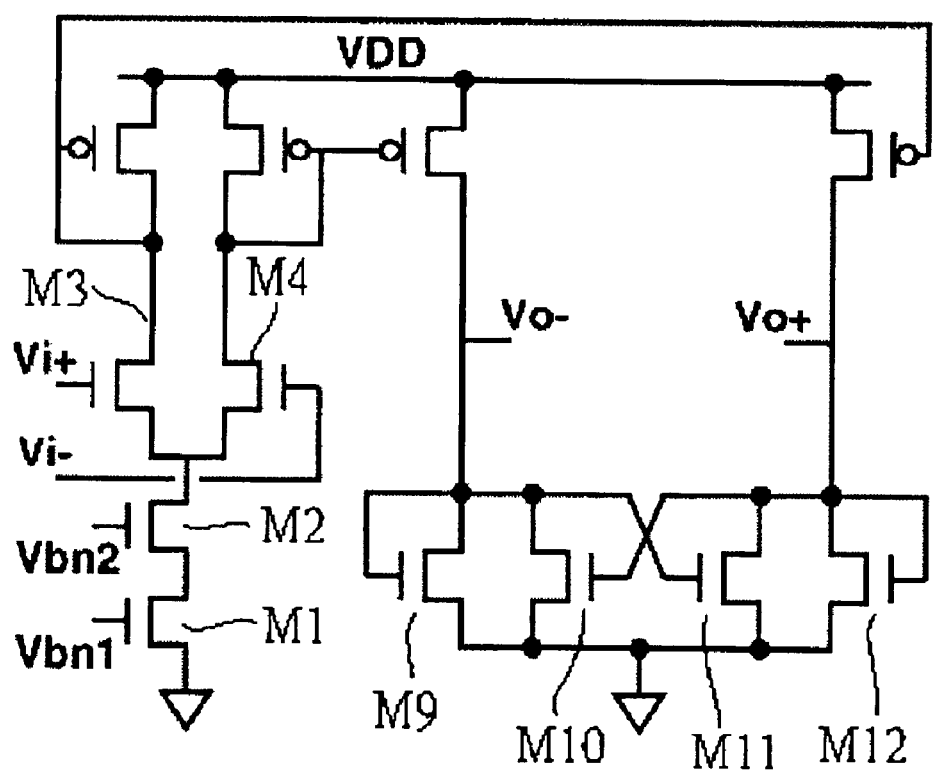
FIG. 5 shows an amplifier with a nearly-infinite output load. The amplifier can be applied to the averaging amplifier circuit in FIG. 4.

FIG. 5 shows an amplifier with nearly-infinite output impedance. This circuit architecture can be applied to the averaging amplifier in FIG. 4. The architecture probably contains a pair of fully differential source-coupled transistors, M3 and M4, a cascaded bias current source, M1 and M2, and a set of cross-coupled loading components, including M9, M10, M11 and M12. All loading components are made up of fully differential architecture. The connected structure of the outer transistors, M9 and M12, is equivalent to positive impedance, and the connected structure of the inner transistors, M10 and M11, is equivalent to negative impedance. The effect of the positive impedance and that of the negative impedance are balanced off to each other, so the loads can achieve high differential-mode output impedances, and its applied architecture can rightly meet the specification of the nearly-infinite output impedance of the averaging amplifier.

Figure 6:
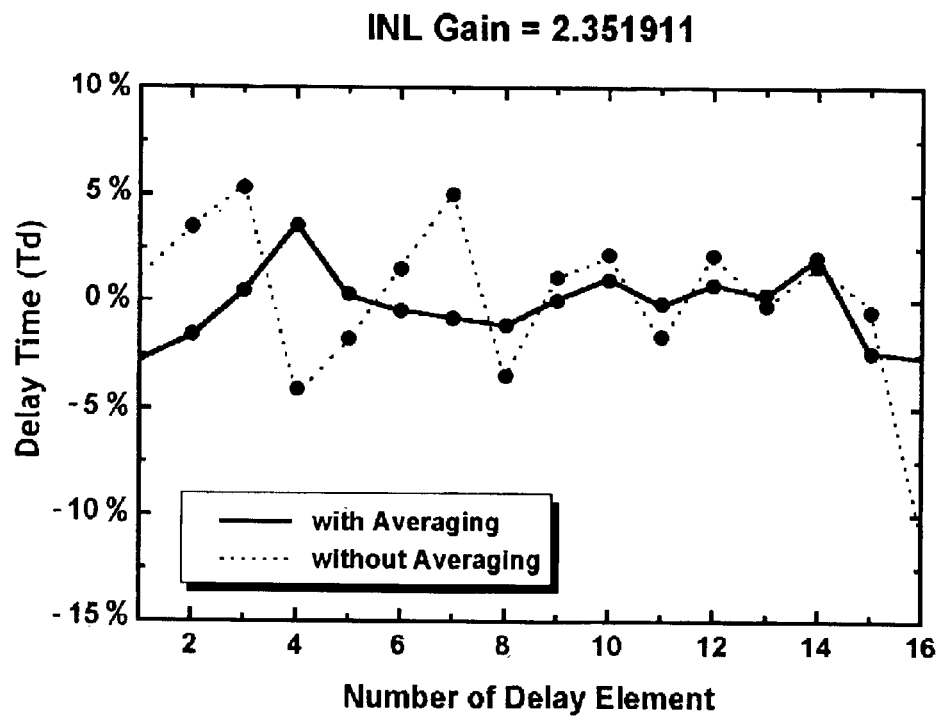
FIG. 6 shows the INL simulation result of the clock generator circuit. The simulation verifies that the circuit incorporated with the proposed averaging circuit performs better than the conventional circuit indeed.

FIG. 6 shows the INL (Integral Nonlinearity) simulation result of the clock generator, where INL means the maximum deviation of the output phase from the ideal condition. In FIG. 6, the dotted line represents the simulation result of the ring-type oscillator without being modified by the averaging circuit and the solid line represents the simulation result of the ring-type oscillator with the averaging circuit shown in FIG. 4. In FIG. 6, the transverse axle indicates the number of the delay units, and the vertical axle indicates the value of the theoretical INL based on a unit of the delay time Td of the delay unit. The difference between the dotted and solid lines will reveal after the averaging effect of about three delay units. The deviation of the solid line is apparently very slighter than that of the dotted line. The contribution of the INL's improvement rightly results from the averaging effect of the averaging circuit, and the gain ratio of the INL is 2.35.

Figure 7:
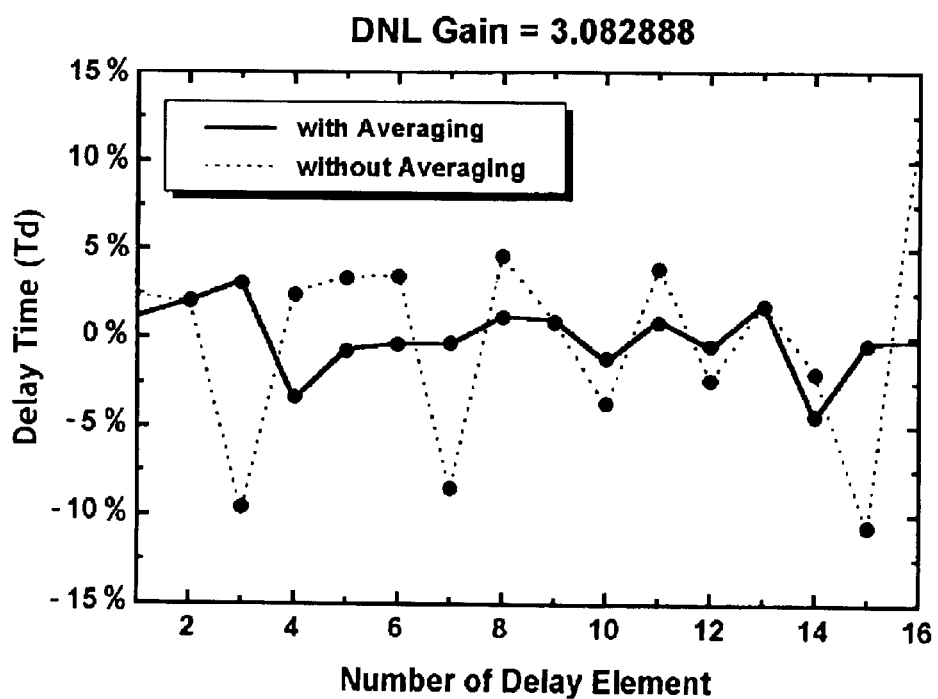
FIG. 7 shows the DNL simulation result of the clock generator circuit. The simulation verifies that the circuit incorporated with the proposed averaging circuit performs better than the conventional circuit indeed.

FIG. 7 shows the DNL (Differential Nonlinearity) simulation result of the clock generator, where DNL means the maximum deviation of the phase interval from the ideal condition. In FIG. 7, the dotted line represents the simulation result of the ring-type oscillator without being modified by the averaging circuit and the solid line represents the simulation result of the ring-type oscillator with the averaging circuit shown in FIG. 4. In FIG. 7, the transverse axle indicates the number of the delay units, and the vertical axle indicates the value of the theoretical INL based on a unit of the delay time Td of the delay unit. The difference between the dotted and solid lines will reveal after the averaging effect of about three delay units. The deviation of the solid line is apparently very slighter than that of the dotted line. The contribution of the DNL's improvement rightly results from the averaging effect of the averaging circuit, and the gain ratio of the INL is 3.08.

In both FIG. 6 and FIG. 7, the simulations make use of TSMC 0.35-$\mu$m CMOS fabrication process to implement 3.3V circuit of 16-stage delay units. When the operating frequency of the circuit of the delay units achieves 125 MHz, the delay time of single-stage delay unit is 250 ps.

Figure 8:
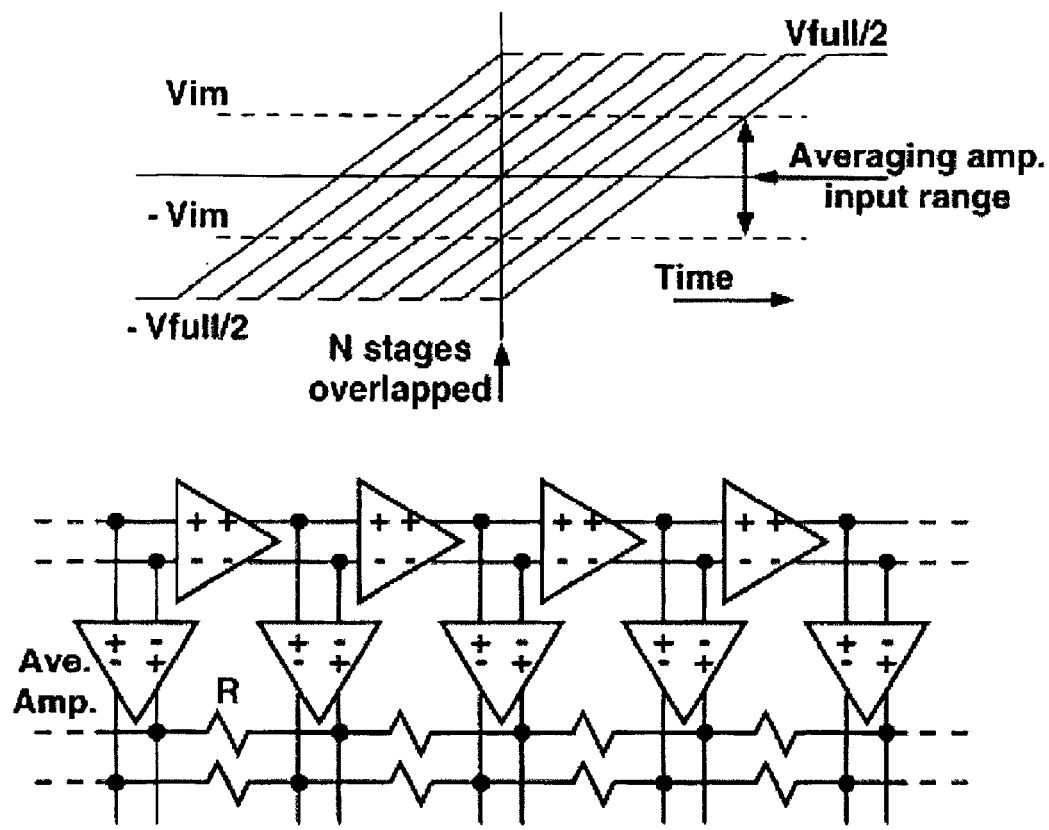
FIG. 8 shows the mapping relationship of the averaging amplifier's input range and the averaging effect.

From FIG. 8, we can clearly figure out the INL's and DNL's improvements of the overall system with the proposed averaging effect. The output voltage's range Vfull of the circuit of the delay units and the linear input's range Vim of the averaging amplifiers are together shown in the upper part of FIG. 8. As for the lower part of FIG. 8 about the averaging circuit, if the input signal's value of the averaging amplifier at the center lies in the middle of the signal range, the averaging current will show a linear symmetric relationship between two next averaging impedances on both sides. However, if the input signal exceeds the linear range's limitation, no current will flows through the averaging impedances because the averaging amplifier enters the saturation region. For instance of the figure, there are five averaging amplifiers whose linear input ranges are overlapped at the same moment. So if one of five averaging amplifiers has a phase shift error, this architecture will shrink the RMS value of the deviation as a ratio of $\sqrt{5}$. In general, if there are N averaging amplifiers whose linear input ranges are overlapped at the same moment, the phase shift error or the INL will be able to shrink as $1/\sqrt{N}$ as the original one, after the averaging effect improves.

In addition, because the measurement method of the DNL is estimated by the timing difference between two adjacent outputs, the correlation of two adjacent outputs will raise after the averaging effect performs. Finally, the performance of the DNL improved by the averaging effect will be more evident. For example of the figure, the DNL shrinks as a ratio of 5. In general cases, the DNL will shrink as a ratio of N.

Referring back to the examples of FIG. 6 and FIG. 7, because there are three averaging amplifiers whose linear input ranges are overlapped at the same moment, the INL is improved by a ratio of $\sqrt{3}$ (1.732) and the DNL is improved by a ratio of 3.

In the proposed averaging architecture of the invention, the averaging effect not only can reduce the phase shift error produced from the mismatch effect of the ring-type oscillator, but also can promote the phase resolution of the oscillator. In ordinary ring-type oscillator, the minimum phase resolution is equivalent to the delay time of one delay unit. So if we like to make the resolution more accurate, it will be helpful for a single-output system to ask the aid of the current-mode phase interpolation circuit, and it will be helpful for a multi-output system to ask the aid of the array of ring-type oscillators. However, the aforementioned solutions both will increase the circuit area, power consumption, and system complexity terribly.

Figure 9:
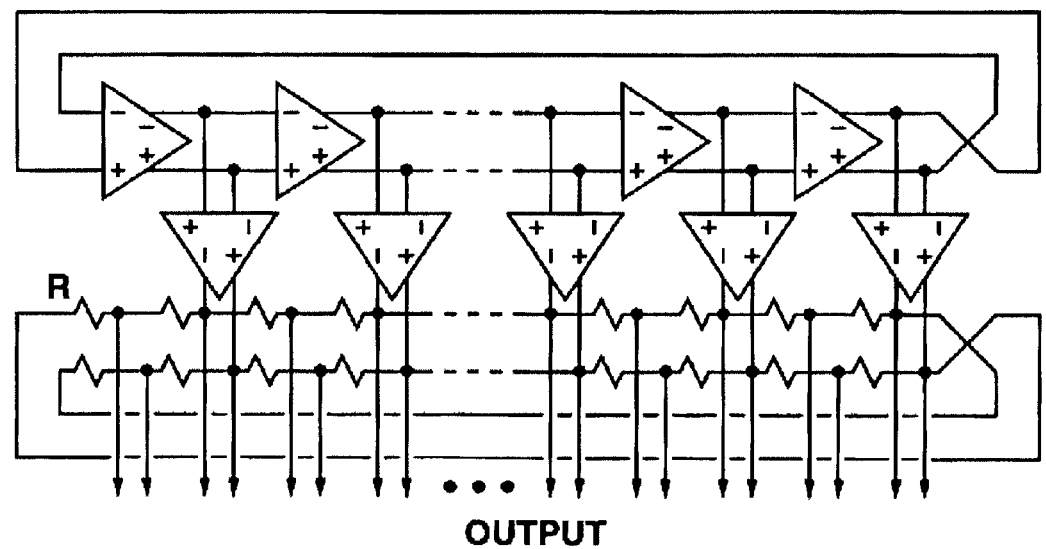
FIG. 9 shows one architecture of voltage-mode phase interpolation circuit according to the proposed invention.

FIG. 9 shows one architecture of twice voltage-mode phase interpolation circuit. In the proposed averaging circuit of the invention, we just divide the averaging impedances among two adjacent averaging amplifiers into N segments equally. Then we can make use of the simple voltage-mode phase interpolation to acquire the constant phase resolution Td/N by directly linking the lines out of the nodes of the averaging impedances. Its operating principle is that when two ends of the impedance connect to two different phase clocks separately, Φ and Ψ, the arbitrary output clock Θ will be equivalent to the weighted sum of two clocks, Φ and Ψ, which are linked out of the impedances to act as the output ends. The equations of the weighted sum can be written as follows:

$$\Theta = (1-\text{weight})\cdot\Phi + \text{weight}\cdot\Psi; \text{weight}=0\sim100\%$$

The architecture of twice voltage-mode phase interpolation circuit in FIG. 9 is implemented by weight=50%. By linking the lines out of the center section of the averaging impedances, the phase resolution can be acquired as follows.

$$\Theta = \Phi/2 + \Psi/2 = (\Phi+\Psi)/2 = Td/2$$

Thus the minimum phase resolution will change from Td to Td/2. In the same way, N-times voltage-mode phase interpolation circuit is implemented by linking (N−1) lines out of the nodes of the averaging impedances equally, and then the minimum phase resolution will change into Td/N.

Figure 10:
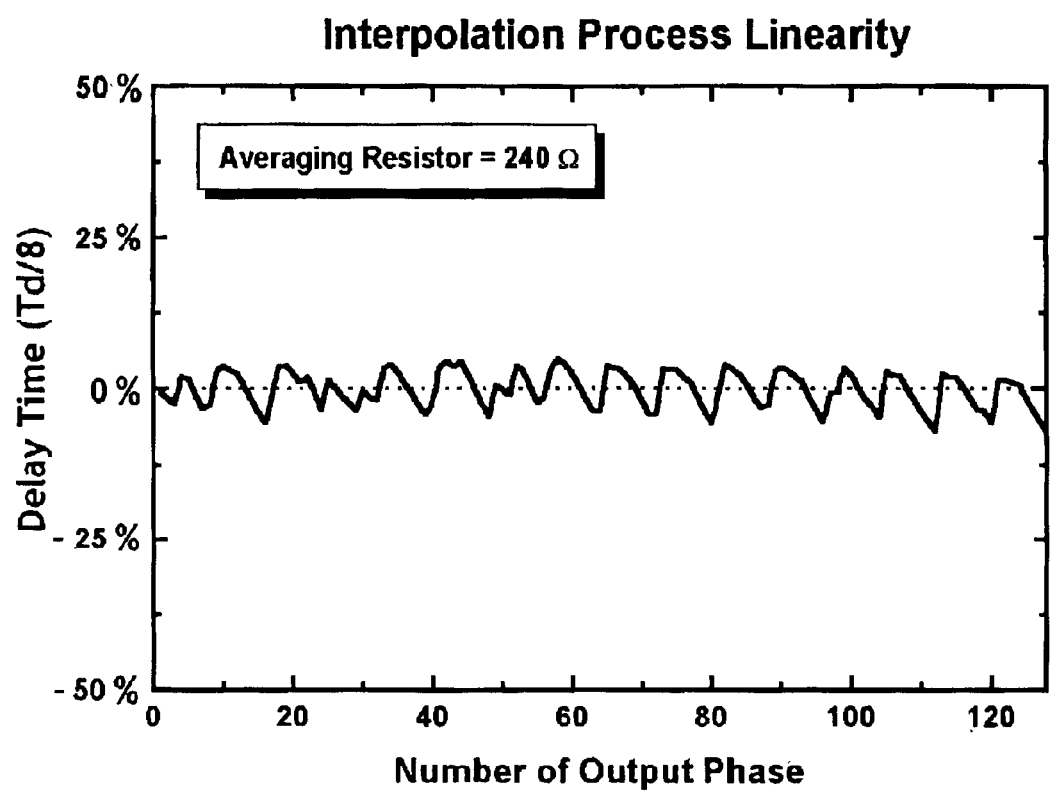
FIG. 10 shows the simulation result of the voltage-mode phase interpolation circuit.

FIG. 10 shows the simulation result of the voltage-mode phase interpolation circuit, which utilizes 8-times voltage-mode phase interpolation. It gets to acquire 128 output phases from the original 16-output ring-type oscillator. On the other hand, the phase interval deducts 2.8125 from 22.5.

FIG. 10 is the simulation result of the 3.3V 8-times 8-stage ring-type oscillator implemented by TSMC 0.35-$\mu$m CMOS fabrication process. When the oscillator operates at the frequency 250 MHz, the phase interval is 31.25 ps.

Figure 11:
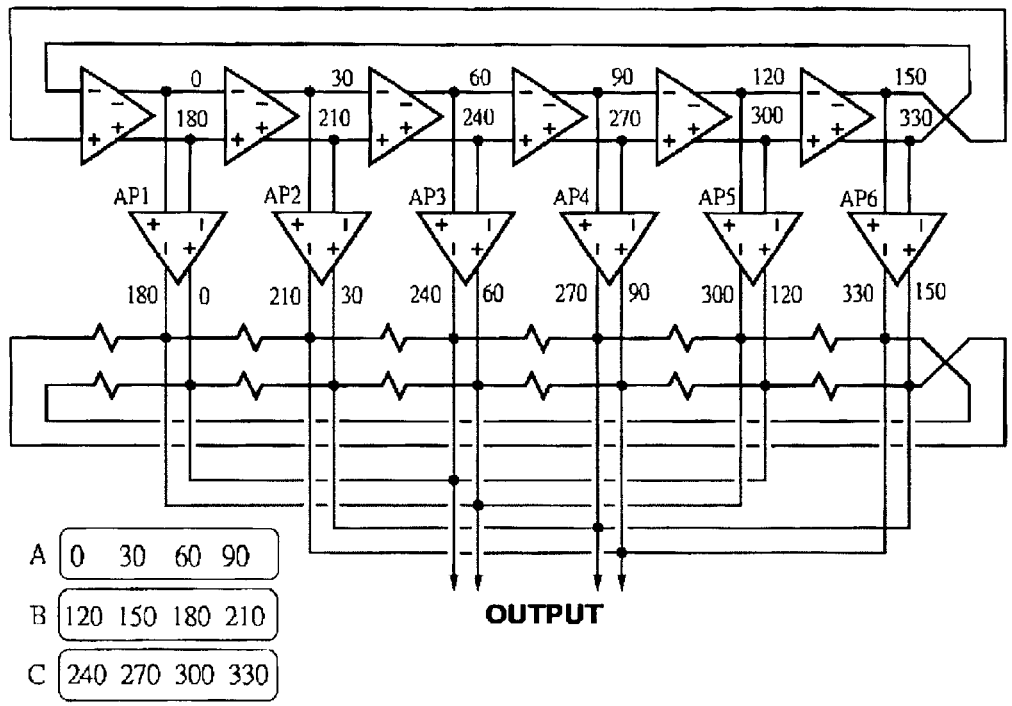
FIG. 11 shows one architecture of folding circuit according the proposed invention.

Besides, the frequency of the output signal of the clock generator is also raised highly by way of the folding architecture. FIG. 11 shows one folding architecture of the averaging circuit. The folding architecture of the averaging circuit is that divides the output pins of the clock generator across the averaging amplifiers into equal-pin W-segments in phase order. Here W is an odd number 3. Three segments are shown as the indication of A, B, and C in FIG. 11. The corresponding pins of each segment connect mutually, i.e. the first group of phase degrees of each segment, "0, 120, 240" are connected to each other, the second group of phase degrees of each segment, "30, 150, 270" are connected to each other, the third group of phase degrees of each segment, "60, 180, 300" are connected to each other, and the forth group of phase degrees of each segment, "90, 210, 330" are connected to each other. The averaging amplifiers that are connected mutually are grouped into the same set. In this case, the AP1, AP3, and AP5 are grouped into one set, and the AP2, AP4, and AP6 are grouped into another set. There are totally two sets. Because the waveform transition of the clock signal brings out only in some delay unit, the output signals of the other even-number delay units in the same set will cancel with each other. For example, if one set has W amplifiers and W is an odd number, then the number of amplifier excluding the amplifier occurring waveform transition is even. So the overall output signal is finally controlled by the amplifier occurring waveform transition. On the other hand, in another set, the output signals of even-number delay units cancel with each other, so the overall output signal is controlled by the last delay unit. For example, if there are W amplifiers in one set, then W−1 amplifiers will cancel with each other and the overall output signal will be controlled by the last one. Therefore, when the waveform transition of the clock signal in the clock generator passes through the delay units for one clock period, there will be W waveform transitions in the output, i.e. the output can produce high-frequency clock signal whose frequency is W times as the operating frequency of the original clock generator.

Figure 12:
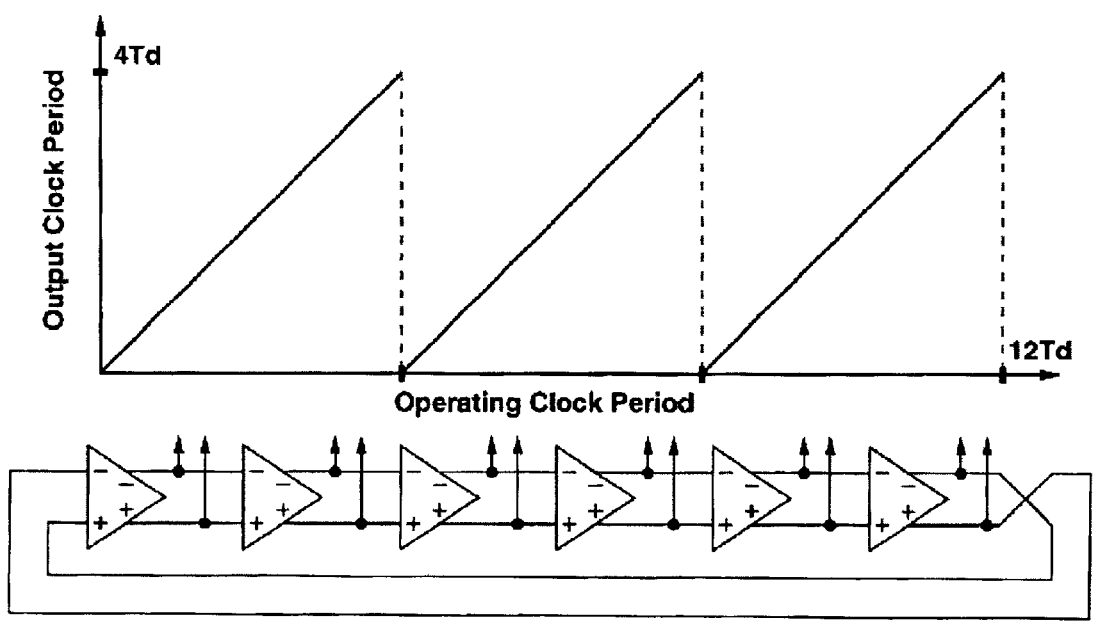
FIG. 12 shows the relationship of the operating clock period and output clock period.

FIG. 12 shows the relationship between the operating clock period and the output clock period of the folding architecture in FIG. 11. FIG. 11 shows a ring-type oscillator constructed of six delay units whose output pins across the averaging amplifiers are divided into three sections in phase order. The corresponding output pins in each section are connected mutually. Referring to FIG. 12, when the clock signal in the ring-type oscillator takes the period time of 12 Td to finish passing through one loop, the signal of the output will takes the period time of 4 Td to finish passing through three loops, i.e. the clock frequency of the output signal is three times as the operating frequency of the original ring-type oscillator.

Although the present invention has been described with reference to specific details of certain embodiments thereof, it is not intended that such details should be regarded as limitations upon the scope of the invention except as and to the extent that they are included in the accompanying claims.

What is claimed is:

1. A clock generator, which comprises:

M delay units (DC) in order of 1 to M, each one of which has invert (−) and non-invert (+) inputs, and further has invert (−) and non-invert (+) outputs, wherein a phase difference between two clock signals from the invert (−) and non-invert (+) outputs in each delay unit (DU) is substantially 180 degrees, and a phase interval between the invert outputs of each two adjacent delay units is substantially equivalent to θ, wherein M is an integer greater than 2;

a first set of impedances (Ra), wherein the n-th impedance ($Ra_n$) is connected to the invert (−) outputs of the (n−1)-th DU and n-th DU, wherein n is an integer greater than 1 and up to M, and M is defined as above; and a second set of impedances (Rb), wherein the n-th impedance ($Rb_n$) is connected to the non-invert (+) outputs of the (n−1)-th DU and n-th DU, wherein both n and M are defined as above, wherein the first and second sets of the impedances have substantially identical impedance, so that a phase shift error originating from a mismatch effect among the M DUs will generate an averaging current flowing through the first and second sets of impedances, and thus phase shift error will be reduced compensatively, and further comprising M amplifiers (AP), each one of which has two inputs and two outputs, wherein two inputs of the (n−1)-th AP are connected to the two outputs of the (n−1)-th DU, wherein $Ra_n$ connects the first output of the (n−1)-th AP to the first output of the n-th AP, and $Rb_n$ connects the second output of the (n−1)-th AP to the second output of the n-th AP, wherein n, M, $Ra_n$, and $Rb_n$ are defined as above, wherein the M APs act as buffers among the M DUs, the first set of impedances, and the second set of impedances, in order to make the M DUs independent from a variation effect of the first set and second set of impedances.

2. The clock generator as defined in claim 1 further comprising:

2 M high-impedance loads, each of which has an impedance higher than that of the first set of impedances and that of the second set of impedances, wherein the 2 M high-impedance loads are connected to the first and second outputs of the M amplifiers separately, so that the averaging current from the first outputs of the M amplifiers substantially all flow through the first set of impedances, and that the averaging current from the second outputs of the M amplifiers substantially all flow through the second set of impedances.

3. The clock generator as defined in claim 2, wherein the 2M high-impedance loads are current sources.

4. The clock generator as defined in claim 1, wherein the first and second sets of impedances are all resistors.

5. The clock generator as defined in claim 2 further comprising:

a first set of N−1 nodes located in the first set of impedances; and a second set of N−1 nodes located in the second set of impedances, wherein N is an integer greater than 1, the first and second sets of nodes divide the first and second sets of impedances into equal-resistance N segments, separately, so that two corresponding nodes between the first and the second sets of the impedances will be able to output two clock signals whose phase difference is substantially 180 degrees, and each two adjacent nodes will output two clock signals whose phase interval is θ/N.

6. The clock generator as defined in claim 1 further comprising:

a first set of N−1 nodes located in the first set of impedances; and a second set of N−1 nodes located in the second set of impedances, wherein N is an integer greater than 1, the first and second sets of nodes divide the first and second sets of impedances into equal-resistance N segments, separately, so that two corresponding nodes between the first and the second sets of the impedances will be able to output two clock signals whose phase difference is substantially 180 degrees, and each two adjacent nodes will output two clock signals those phase interval is θ/N.

7. The clock generator as defined in claim 1, wherein the 2M outputs of the M APs are divided into W segments in phase order with an equal number of outputs, wherein W is an odd number, and all corresponding outputs from each segment are tied together, so that clock signals from the resulting tied outputs have a clock period of (2MTd)/W, wherein Td is delay time of a single delay unit of said M delay units.

* * * * *